United States Patent
Petrov et al.

(10) Patent No.: US 7,197,091 B1
(45) Date of Patent: Mar. 27, 2007

(54) DIRECT CONVERSION RECEIVER WITH DIRECT CURRENT OFFSET CORRECTION CIRCUITRY

(75) Inventors: Andrei R. Petrov, Pocatello, ID (US); Craig L. Christensen, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 793 days.

(21) Appl. No.: 10/430,656

(22) Filed: May 6, 2003

(51) Int. Cl.
*H03D 3/22* (2006.01)
*H04L 27/22* (2006.01)

(52) U.S. Cl. .................. 375/332; 330/332; 341/118; 455/130; 455/131

(58) Field of Classification Search ............. 375/319, 375/340, 330, 332, 345; 341/118; 455/130, 455/131
See application file for complete search history.

(56) References Cited

U.S. PATENT DOCUMENTS

| | | | |
|---|---|---|---|
| 3,961,262 A | 6/1976 | Gassmann | 325/345 |
| 4,276,513 A | 6/1981 | Johnston et al. | 330/9 |
| 4,599,743 A | 7/1986 | Reed | 455/207 |
| 4,736,390 A | 4/1988 | Ward et al. | 375/75 |
| 4,814,715 A | 3/1989 | Kasperkovitz | 329/50 |
| 4,942,365 A | 7/1990 | Satterwhite | 328/134 |
| 4,944,025 A * | 7/1990 | Gehring et al. | 455/207 |
| 4,961,206 A * | 10/1990 | Tomlinson et al. | 375/261 |
| 5,086,437 A | 2/1992 | Tomita | 375/98 |
| 5,241,702 A | 8/1993 | Dent | 455/278.1 |
| 5,263,194 A | 11/1993 | Ragan | 455/316 |
| 5,442,655 A | 8/1995 | Dedic et al. | 375/340 |
| 5,461,646 A | 10/1995 | Anvari | 375/347 |
| 5,501,903 A | 3/1996 | Erkkila et al. | |
| 5,510,187 A | 4/1996 | Kumar et al. | |
| 5,530,926 A | 6/1996 | Rozanski | 455/277.2 |
| 5,561,673 A | 10/1996 | Takai et al. | 371/5.5 |
| 5,617,060 A | 4/1997 | Wilson et al. | 330/129 |
| 5,634,204 A | 5/1997 | Takahashi et al. | 455/134 |
| 5,692,019 A | 11/1997 | Chang et al. | 375/347 |
| 5,740,530 A | 4/1998 | Labedz et al. | 455/403 |
| 5,818,543 A | 10/1998 | Lee | 348/725 |

(Continued)

OTHER PUBLICATIONS

C. Menolfi and Q. Huang, "A Low-Noise CMOS Instrumentation Amplifier for Thermoelectric Infrared Detectors", IEEE J. Solid-State Circuits, vol. 32, No. 7, pp. 968-976, Jul. 1997.

(Continued)

*Primary Examiner*—Jay K. Patel
*Assistant Examiner*—Curtis Odom
(74) *Attorney, Agent, or Firm*—Workman Nydegger

(57) ABSTRACT

A direct conversion circuit that includes an in-phase and quadrature-phase feedback path that reduces Direct Current (DC) offset. Each feedback path includes a compensating mixer that generates an error correction voltage that is passed through a loop gain circuit and an integrator. The integrated signal is applied to the output of a low pass filter that operates on the down-converted baseband signal. The direction conversion circuit may not only down convert the received modulated signal using a down-converting mixer into a baseband signal, but also, after performing a passive low pass filtering to remove higher-order components, performs up-conversion of the baseband signal using an up-converting mixer. This allows active elements operating on the up-converted signal to introduce less 1/f noise.

26 Claims, 6 Drawing Sheets

U.S. PATENT DOCUMENTS

| | | |
|---|---|---|
| 5,827,600 A | 10/1998 | Ejiri et al. |
| 5,889,826 A | 3/1999 | Takahashi .................. 315/347 |
| 5,953,640 A | 9/1999 | Meador et al. ............... 455/73 |
| 6,002,672 A | 12/1999 | Todd ......................... 370/252 |
| 6,009,307 A | 12/1999 | Granata et al. ............ 455/13.3 |
| 6,018,647 A | 1/2000 | Fitzgerald ................... 455/135 |
| 6,023,615 A | 2/2000 | Bruckert et al. ......... 455/277.2 |
| 6,029,058 A | 2/2000 | Namgoong et al. ......... 455/324 |
| 6,085,076 A | 7/2000 | Lindsay et al. .......... 455/277.1 |
| 6,099,895 A | 8/2000 | Mayo et al. |
| 6,148,184 A | 11/2000 | Manku et al. ............... 455/110 |
| 6,172,970 B1 | 1/2001 | Ling et al. .................. 370/347 |
| 6,175,728 B1 * | 1/2001 | Mitama .................... 455/323 |
| 6,188,880 B1 | 2/2001 | Sanielevici ................. 455/296 |
| 6,192,225 B1 | 2/2001 | Arpaia et al. ............ 455/196.1 |
| 6,212,244 B1 | 4/2001 | Davidovici et al. ......... 375/345 |
| 6,225,848 B1 | 5/2001 | Tilley et al. ................. 327/307 |
| 6,246,867 B1 | 6/2001 | Jakobsson ................... 455/324 |
| 6,249,249 B1 | 6/2001 | Obayashi et al. ............ 342/371 |
| 6,275,542 B1 | 8/2001 | Katayama et al. .......... 375/322 |
| 6,327,313 B1 | 12/2001 | Traylor et al. .............. 375/316 |
| 6,330,433 B1 | 12/2001 | Jager ........................ 455/277.2 |
| 6,516,185 B1 * | 2/2003 | MacNally ................. 455/234.1 |
| 2003/0174079 A1 * | 9/2003 | Soltanian et al. ........... 341/118 |

OTHER PUBLICATIONS

C.C.Enz, E.A. Vittoz, and F. Krummenacher, 'A CMOS Chopper Amplifier', IEEE J. Solid-State Circuits, vol. SC-22, No. 3, pp. 335-342, Jul. 1987.

D.K. Weaver, Jr., "Third Method of Generation and Detection of Single-Sideband Signals", Proc. IRE, pp. 1703-1705, Jun. 1956.

* cited by examiner

DIRECT CONVERSION RECEIVER WITH DIRECT CURRENT OFFSET CORRECTION CIRCUITRY

BACKGROUND OF THE INVENTION

1. The Field of the Invention

The present invention relates to analog integrated circuit design, and more particularly, to direct conversion receivers having reduced Direct Current (DC) offset.

2. Background and Related Art

Electrical signals have proven to be an effective means of conveying data from one location to another. The further a signal is transmitted, however, the greater the decay in the signal and the greater the chance for irreversible loss in the data represented by the signal. In order to guard against this signal decay, the core electrical signal that represents the data (i.e., the baseband signal) may be modulated or superimposed on a carrier wave in the Radio Frequency (RF) frequency spectrum.

In order to properly interpret the signal, conventional RF receivers extracts the baseband signal from the received signal. The data represented by the extracted baseband signal may then be interpreted by other downstream circuitry. In order to perform this extraction, typical receivers include circuitry which first converts the received radio frequency modulated signal into an intermediate frequency ("IF") signal. This intermediate frequency signal is then converted into the baseband signal for further data processing. Receiver architectures that convert through the intermediate frequency are often called "heterodyne" receiver architectures. Naturally, circuit elements (called "IF components") are required in order to deal with the intermediate conversion to and from the intermediate frequency.

It is desirable to reduce the cost, size, and power consumption of a particular receiver architecture design for strategic marketing of the receiver. This is particularly true of wireless RF receivers since those receivers are often portable and run on battery power. One technology developed in order to reduce RF receiver cost, size, and power consumption is called "direct conversion." Direct conversion refers to the direct conversion of RF modulated signals into corresponding baseband signals without requiring conversion through the intermediate frequency. Such direct conversion receiver architectures are often also called "zero-IF," "synchrodyne," or "homodyne" receiver architectures.

FIG. 5 illustrates a conventional direct conversion circuit 500 in accordance with the prior art. The circuit 500 includes an antenna 501 which receives the RF modulated signal. The antenna 501 then provides the received signal to an amplifier 502 which amplifies the signal for further processing. The amplifier 502 may be, for example, an RF low noise amplifier.

The amplified signal is then split into two branches, an "in-phase" branch 510, and a "quadrature-phase" branch 520. Each branch includes a mixer that initially receives the amplified signal. For instance, the in-phase branch 510 includes an in-phase mixer 511, and the quadrature-phase branch 520 includes a quadrature-phase mixer 521. A local oscillator 530 provides a sine or square wave signal as a control signal to each of the mixers. Each mixer is configured to nonlinearly process the amplified signal and control signal, resulting in output signal components at frequencies equal to the sum and difference of amplified signal and control signal frequencies, plus higher-order components at other frequencies. The circuit includes a 90-degree phase shifter 531 which causes the control signal for the quadrature-phase mixer 521 to be 90 degrees out of phase with the control signal for the in-phase mixer 511.

The signal from the in-phase mixer 511 is then passed through a low pass filter 512 to a baseband amplifier 513 to complete the extraction of the baseband (difference frequency) signal from the received signal as far as the in-phase branch 510 is concerned. Likewise, the signal from the quadrature-phase mixer 521 is passed through a low pass filter 522 to a baseband amplifier 523 to complete the extraction of the baseband (difference frequency) signal as far as the quadrature-phase branch is concerned. The in-phase and quadrature-phase baseband signals are then processed by signal processing circuitry 550.

The direct conversion circuit of FIG. 5 does not convert through an intermediate frequency and thus there are no IF components needed to deal with an intermediate conversion. Consequently, the direct conversion circuit of FIG. 5 is smaller, and requires less power than conventional heterodyne receiver architectures. Furthermore, the direct conversion circuit does not have to deal with image suppression as much as do heterodyne receivers.

However, there are some performance issues for the direct conversion circuit of FIG. 5 that limit its practical implementation. In particular, conventional direct conversion circuits suffer from Direct Current (DC) offset. The DC offset in conventional direct conversion receivers has two primary origins. One primary origin is the down-converting mixer itself in which the DC offset are self-mixing DC products present at the mixer outputs. The other primary DC offset origin is in active elements, such as highly sensitive amplifiers, that operate on the down-converted baseband signal. Such DC offsets can swamp out the much weaker desired signal.

Direct conversion circuits have many advantages in terms of size, power consumption, and cost to manufacture. In addition, direct conversion circuits also have good selectivity and the mitigation of an image frequency. However, as mentioned above, many direct conversion circuits also have some drawbacks in the form of increased DC offset. Accordingly, what would be advantageous are direct conversion circuits that have reduced DC offset.

BRIEF SUMMARY OF THE INVENTION

The foregoing problems with the prior state of the art are overcome by the principles of the present invention, which are directed towards a direct conversion circuit that includes an in-phase and quadrature-phase feedback path that reduces Direct Current (DC) offset. Each feedback path includes a compensating mixer that generates an error correction voltage that is passed through a loop gain circuit and an integrator. The integrated signal is applied to the output of a low pass filter that operates on the down-converted baseband signal. The direction conversion circuit may not only down convert the received modulated signal using a down-converting mixer into a baseband signal, but also, after performing a passive low pass filtering to remove higher-order components, performs up-conversion of the baseband signal using an up-converting mixer. This allows active elements operating on the up-converted signal to introduce less 1/f noise.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention are directed towards a direct conversion circuit that includes a compensating mixer that feeds back into the output terminals of the low pass filter that follows the down-converting mixer to thereby at least partially compensate for Direct Current (DC) offset. DC offset and also 1/f noise may be reduced further by including an up-converting mixer following the down-converting mixer.

In this description and in the claims, one node in a circuit is "coupled" to another node in the circuit if charge carriers freely flow (even through some devices and/or with some resistance) between the two nodes during normal operation of the circuit. One node in a circuit is "capacitively coupled" to another node in the circuit if there are one or more capacitors that intervene between the two nodes. One node in a circuit is "at least capacitively coupled" to another node if the two nodes are either coupled together as just defined, or are capacitive coupled together as just defined.

In this description and in the claims, a signal being "down-converted" means that the signal is operated upon such that its frequency spectrum tends more towards lower frequencies as compared to before the operation, the operation occurring without any loss in the core data represented by the signal. A signal being "up-converted" means that the signal is operated upon such that its frequency spectrum tends more towards higher frequencies as compared to before the operation, the operation also occurring without any loss in the core data represented by the signal.

Figure 1:
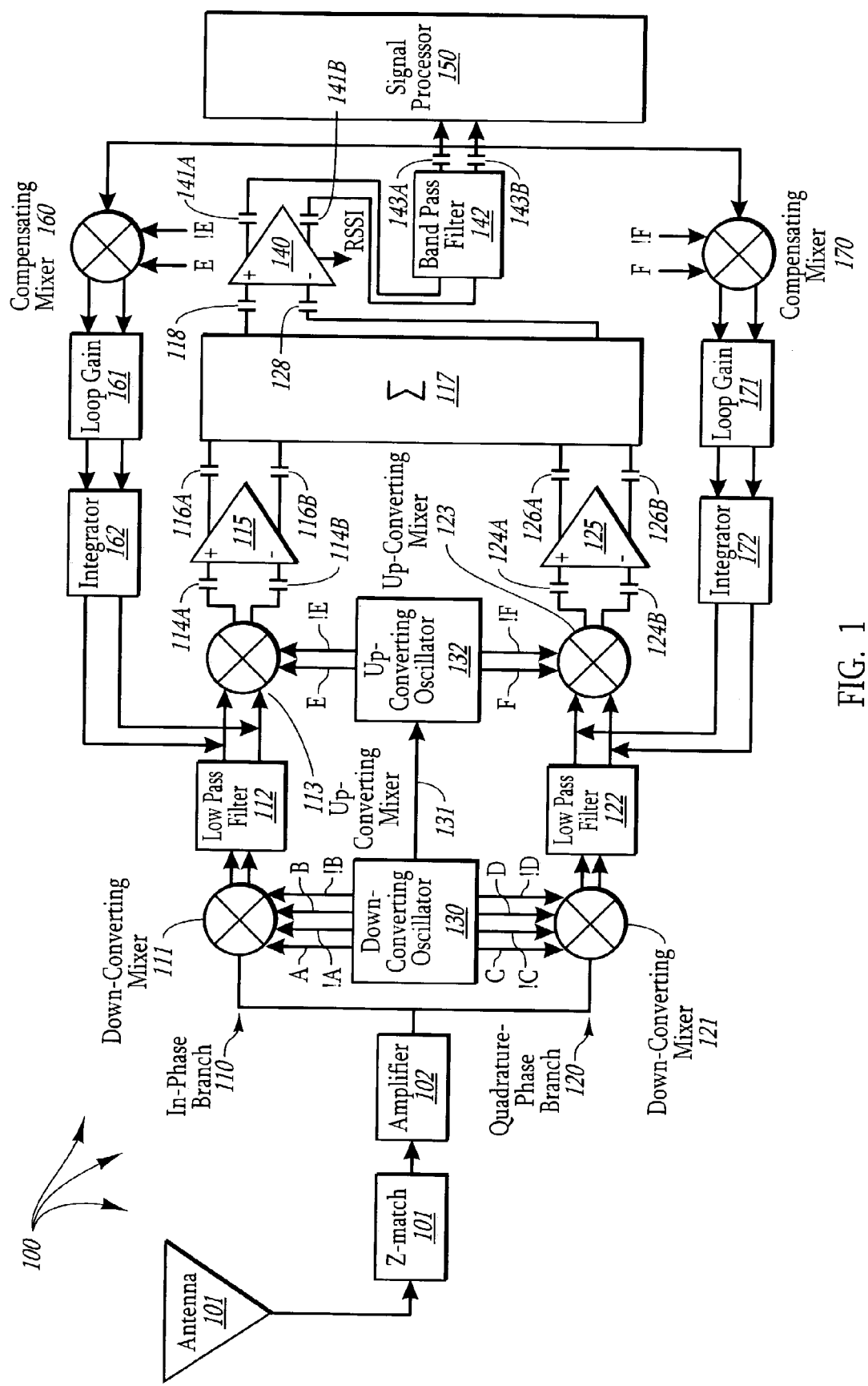
FIG. 1 illustrates a high-level circuit schematic of a direct conversion circuit in accordance with the principles of present invention.

FIG. 1 illustrates a direct conversion receiver circuit 100 in accordance with the principles of the present invention. The direct conversion receiver circuit 100 includes an antenna 101 which converts a signal over-the-air to a signal on the wire. However, direct conversion circuitry may operate even when the signal is received over a physically channeled conduit such as a wire, in which case there would be no need for antenna 101 since the signal would already be represented on a physical conduit.

An amplifier 102 amplifies the received signal so as to generate a signal of sufficient magnitude upon which to perform subsequent operations. An impedance matching circuit 101A operates to match the impedance of the antenna 101 and the input impedance of the amplifier 102 so as to improve admittance of the signal from the antenna 101 to the remaining circuitry. Such impedance matching reduces reflectance of the signal and improves power transfer as is known to those or ordinary skill in the art. The frequency response of the impedance matching circuit 101A also acts as a band pass filter, which is useful to filter out harmonics of the oscillator 130. The amplifier 102 may be a low noise amplifier of the type commonly used to amplify a received signal in direct conversion receiver circuits.

The amplified signal from the amplifier 102 is then provided to an "in-phase" branch 110, and to a quadrature phase branch 120. The terms "in-phase" is used not to represent that the signal in the branch is "in-phase", but only to represent that the signal in the in-phase branch 110 after the down-converting mixer 111 is approximately orthogonal to the signal in the quadrature-phase branch 120 after down-converting mixer 121.

Signals that are passed through the in-phase branch 110 are first provided to a down-converting single input to differential output mixer 111, which down-converts the signal to thereby extract the baseband signal. A down-converting oscillator 130 provides control signals A, B, !A and !B. Control signals A and B each having a duty cycle of approximately twenty-five percent and are approximately 180 degrees out of phase with each other. Control signals !A and !B are the binary complement of control signals A and B, respectively.

These control signals may be cycled at approximately the frequency of the carrier frequency of the received signal. However, to achieve a substantial reduction in DC offset resulting from the self-mixing product of the mixer 111 at its output terminals, the mixer control signals A, B, !A and !B are operated at a twenty-five percent duty cycle at the frequency of the received signal. Furthermore, control signals A and B (and !A and !B) shift 180 degrees relative to each other. Thus results in the leakage combination being a square wave at twice the frequency of the received signal. This reduction in DC offset stems from the fact that even if the control signals were to irradiate back to the antenna (and thus introduce feedback into the mixer), the leakage component would be twice the frequency of the carrier frequency of the signal, thereby resulting in very little DC component in the self-mixing product.

Additionally, the mixer 111 has a differential output that results in a reduction of second-order intermodulation product (also often referred to as "IP2"). The second-order intermodulation product is a product of a squaring function. Accordingly, the polarity of the second-order intermodulation product will be the same for each of the differential outputs of the mixer 111. Accordingly, the second-order intermodulation product manifests itself as a common mode signal at the differential output terminals of the mixer 111. The common mode rejection capability of subsequent circuitry that operates on the signal will thus reduce the effect of the second-order intermodulation product.

The signal output from the mixer 111 will not only include the baseband signal having the data of interest, but will also include higher frequency components that do not contain the desired data. Accordingly, the output signals from the mixer 111 are passed through a low pass filter 112 to remove the higher frequency components including all out of band signals and noise as well as the potential secondary image created by the up-converting mixer 113. The output from the low pass filter 112 will thus include only the baseband signal having the data of interest. This low pass filter 112 may be a passive element such as a Resistor-Capacitor (RC) filtering circuit. The low pass filter 112 should have a cutoff frequency that provides sufficient channel selectivity of the baseband signal. This may be accomplished using a four pole low pass filter composed of four RC low pass filters cascaded in series. By so doing, a roll-off of 80 decibels per decade may be accomplished. The use of a passive low pass filter allows for reduced or even eliminated DC offset since such passive elements do not generate the same 1/f noise that active elements do. Also, the use of the passive filter does not significantly reduce dynamic range in the way that an active filter would. The passive components of low pass filter 112 assures that there will not be any consequential degradation of the desired signal by flicker noise and that only a small amount of white noise is added.

Typically, in conventional direct conversion receiver circuits, the baseband signal itself is processed by active elements (such as high sensitivity amplifiers) in downstream circuitry. However, such active elements introduce significant 1/f noise since the baseband signal has a frequency spectrum tending towards lower frequencies. "1/f noise" refers to an effect whereby active elements introduce more noise when operating on lower frequencies, than they do on higher frequencies. Such an effect is common in any active elements. In accordance with the principles of the present invention, active elements do not operate upon the baseband signal itself, but on an up-converted version of the baseband signal. Accordingly, the noise introduced by the active element on the up-converted version of the baseband signal is much lower thereby preserving the dynamic range of the direct conversion receiver as a whole.

Specifically, the filtered baseband signal output by the low pass filter 112, is passed to an up-converting mixer 113 controlled by control signals E and !E provided by an up-converting oscillator 132. The control signals E and !E have a duty cycle of approximately 50% (or 25%) and are 180 degrees out of phase with each other. Additionally, the cycle frequency of the control signals E and !E is equal to the cycle frequency of the control signals A, B, !A and !B divided by some positive integer greater than one. In order to accomplish this, the down-converting oscillator 130 and the up-converting oscillator 132 may be interconnected as illustrated by arrow 131 so to enforce this frequency division relation. This may be accomplished using conventional frequency division circuitry.

Accordingly, the mixer 113 outputs an up-converted version of the baseband signal, which has a frequency spectrum tending towards higher frequencies than does the baseband signal itself. The frequency of the mixer 113 may be chosen in conjunction with the low pass filter 112 cutoff frequency to provide a desired level of image suppression from input signals spaced at integer multiples of the lower frequency of the mixer 113 from the baseband output of the mixer 111. Thus, the modifications of the direct conversion architecture not only provide reduction in DC offset and 1/f noise, but also retain the benefit of image suppression characteristic of direct convention receiver circuits. Amplification may be performed on the intermediate frequency signal output by the up-converted mixer 113 without the flicker noise of the amplifier introducing consequential degradation into the signal.

The downstream circuitry that includes active elements then operates directly on this higher frequency version of the baseband signal. Accordingly, the active components, such as amplifier 115, do not introduce as much 1/f noise. Furthermore, the subsequent circuitry may be interconnected via intervening capacitors since a higher frequency signal is being processed. This reduces and potentially even eliminates the impact of any DC offset or drift introduced by the active components as well. For instance, the differential outputs of the up-converting mixer 113 are passed to the amplifier 115 via capacitors 114A and 114B. The differential outputs of the amplifier 115 may be provided to the summer 117 via capacitors 116A and 116B. The output of the summer 117 may be provided to the limiting amplifier via capacitor 118. Accordingly, the amplifier 115 receives and amplifies the up-converted in-phase signal, while the summer 117 sums the differential up-converted in-phase signal to thereby generate a summed in-phase signal.

The quadrature-phase branch 120 is similar to the in-phase branch 110 in that the down-converting mixer 121, control signal C, control signal D, control signal !C, control signal !D, low pass filter 122, up-converting mixer 123, control signal F, control signal !F, capacitors 124A and 124B, amplifier 125, capacitors 126A and 126B, summer 127 and capacitor 128 may have the same structure and interconnections as described above for their respective elements in the in-phase branch. However, the control signals C, D, !C, !D, F and !F will be 90 degrees out of phase with respective signals A, B, !A, !B, E and !E. The quadrature-phase branch 120 generates a summed quadrature-phase signal in a similar manner as described above for the in-phase branch 110 generating the summed in-phase signal.

The use of a quadrature-phase branch 120 is helpful in that it allows the receiving cycle to be asynchronous with the modulation cycle. However, in the event that the in-phase branch 110 is synchronized with the modulation cycle of the received signal without the use of the quadrature-phase branch 120, the quadrature-phase branch 120 would not strictly be necessary.

A differential limiting amplifier 140 receives the summed in-phase and quadrature-phase signals and amplifies the summed in-phase and quadrature-phase signals in a limited fashion. The limiting amplifier 140 generates a filtered signal that is provided via capacitors 141A and 141B to the band pass filter 142. The limiting amplifier 140 may also generate a Received Strength Signal Indicator (RSSI) that is a log function of the amplitude of the amplified signal. The summer 117 has two differential inputs and one differential output for summing of the in-phase and the quadrature-phase signals. The summer 117 and limiting amplifier 140 may be designed to produce a band pass frequency response that provides additional selectivity to the receiver with respect to the up-converted in-phase signal as will be known to those of ordinary skill in the art after having reviewed this description. The summer 117 and the limiting amplifier 140 may be designed to produce a band pass frequency response that provides additional selectivity to the receiver with respect to the up-converted quadrature-phase signal. This helps to increase the number of modulation schemes that the receiver may handle.

A band pass filter 142 receives the amplified up-converted signal via capacitors 141A and 141B to thereby further filter out any unwanted frequency components. The filtered signal is then provided via capacitors 143A and 143B to the signal processor 150 for signal interpretation. The receiver circuit 100 also includes an in-phase differential feedback path comprising a compensating mixer 160, a loop gain circuit 161, and an integrator 162 configured as shown. Similarly, the receiver circuit 100 includes a quadrature-phase feedback path comprising a compensating mixer 170, a loop gain circuit 171, and an integrator 172 configured as shown. Without these two feedback paths, there would be some relatively high level of DC offset in the filtered signal output by the band pass filter 142 as compared to not having such feedback paths.

Specifically, the compensating mixer 160 receives signals E and !E and performs down-converting mixing to generate an in-phase error corrective voltage. The compensating mixer 160 may be structured the same as the up-converting mixer 213 of FIG. 2A or FIG. 3. The in-phase error corrective voltage is amplified by loop gain 161, and integrated by integrator 162. The resulting integrated signal is then applied to the output of the low pass filter 112 and has the effect of reducing DC offset that would otherwise be present at the output of the low pass filter 112. Similarly, the compensating mixer 170 receives signals E and !E and performs down-converting mixing to generate a quadrature-phase error corrective voltage. The compensating mixer 170 may be structured the same as the up-converting mixer 213 of FIG. 2A or FIG. 3. The quadrature-phase error corrective voltage is amplified by loop gain 171, and integrated by integrator 172. The resulting integrated signal is then applied to the output of the low pass filter 112 and has the effect of reducing DC offset that would otherwise be present at the output of the low pass filter 112.

Figure 2A:
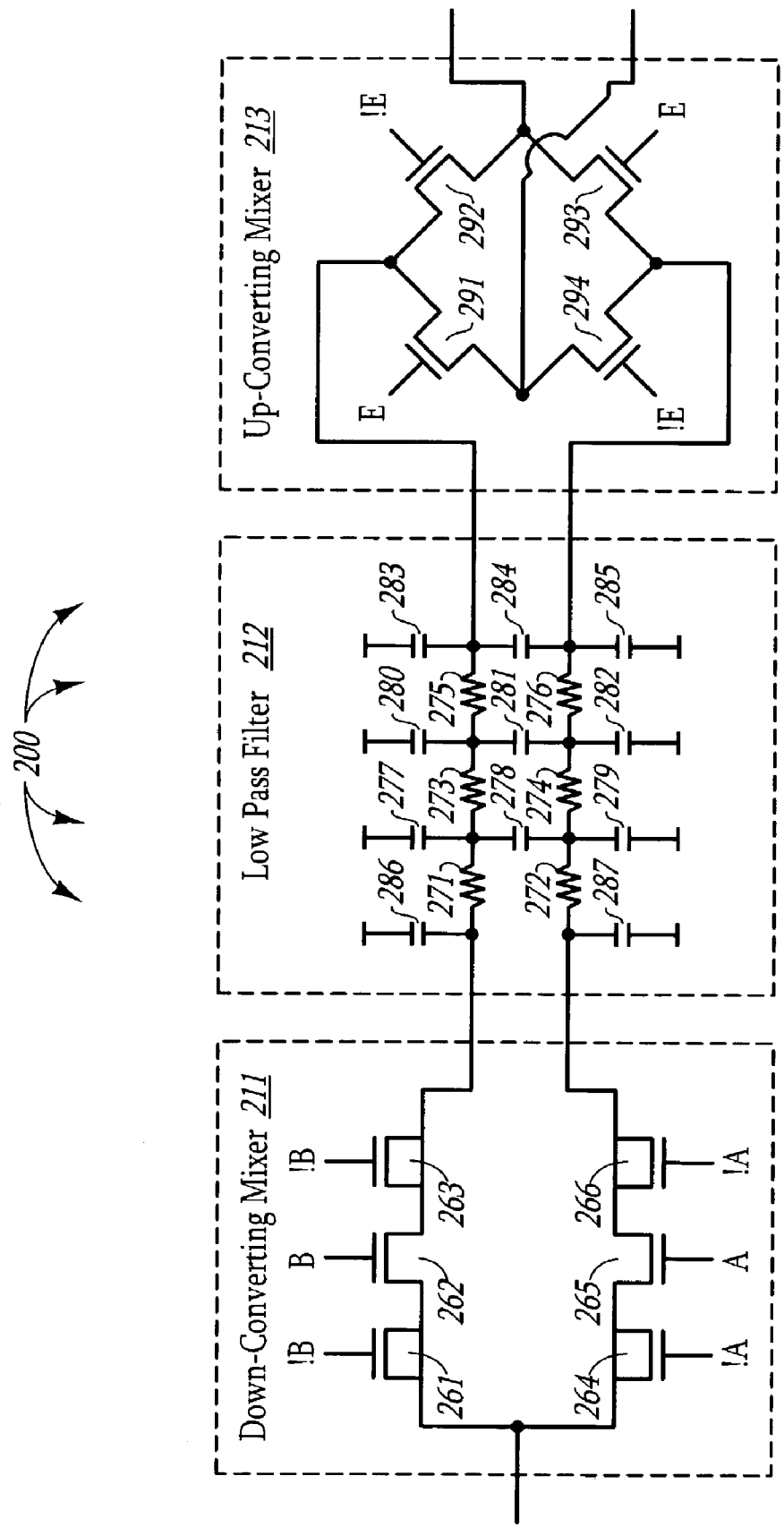
FIG. 2A illustrates a component-level circuit diagram showing further details of an embodiment of the down-converting mixer, a low pass filter, and an up-converting mixer that may be used in the circuit of FIG. 1 as passive elements.

FIG. 2A illustrates a specific embodiment 200 of an interconnected down-converting mixer 211, low pass filter 212, and up-converting mixer 213, which may be examples of down-converting mixer 111, low pass filter 112, and up-converting mixer 113, respectively, of FIG. 1. Additionally, they may be examples of down-converting mixer 121, low pass filter 122, and up-converting mixer 123, respectively, of FIG. 1.

The down-converting mixer 211 has one input terminal and two output terminals. Field-effect transistors 261 through 263 are coupled with their channel regions in series between the input terminal and the upper output terminal of the down-converting mixer 211. Field-effect transistors 264 through 266 are coupled with their channel regions in series between the input terminal and the lower output terminal of the down-converting mixer 211. Field effect transistors 261, 263, 264 and 266 have their source and drain connections shorted. To minimize charge injection while accomplishing down-conversion, down-converting control signal A is applied at the gate terminal of field-effect transistor 265, while down-converting control signal !A is applied at the gate terminal of field-effect transistors 264 and 266. Similarly, down-converting control signal B is applied at the gate terminal of field-effect transistor 262, while down-converting control signal !B is applied at the gate terminal of field-effect transistors 261 and 263.

As previously mentioned, the down-converting control signals A, B, !A, and !B may be cycled at about twice the carrier frequency of the received signal thereby reducing DC offset introduced by the down-converting mixer 211. Additionally, second-order intermodulation product introduced by the down-converting mixer 211 may be reduced by the common mode rejection properties of downstream circuitry.

The low pass filter may be any passive low pass filter that includes one or more poles. However, in the illustrated embodiment, filter 212 is a resistor-capacitor circuit that has a low pass frequency response for each of the differential input signals. As will be apparent to those or ordinary skill in the art, the resistor-capacitor circuit has a frequency response that includes four poles. The low pass filter 212 may include resistors 271 through 276 and capacitors 277 through 287 configured as shown in FIG. 2A. By designing these resistor and capacitors with appropriate values, the position of those poles may be adjusted. In one embodiment, in order to obtain a high roll-off for better selectivity of the passed signal, the four poles are adjusted to be coincident so as to have an 80 dB/decade roll-off. The low pass filter 212 is a passive element and thus does not introduce new DC offset or 1/f noise into the signal, thereby preserving dynamic range.

The up-converting mixer 213 includes two input terminals, two output terminals, and four field-effect transistors 291 through 294. The field-effect transistor 291 has its channel region coupled between the upper input terminal and the lower output terminal of the up-converting mixer 213 and is controlled at its gate terminal by up-converting control signal E. The field-effect transistor 292 has its channel region coupled between the upper input terminal and the upper output terminal of the up-converting mixer 213 and is controlled at its gate terminal by up-converting control signal !E. The field-effect transistor 293 has its channel region coupled between the lower input terminal and the upper output terminal of the up-converting mixer 213 and is controlled at its gate terminal by up-converting control signal E. The field-effect transistor 294 has its channel region coupled between the lower input terminal and the lower output terminal of the up-converting mixer 213 and is controlled at its gate terminal by up-converting control signal !E.

Figure 2C:
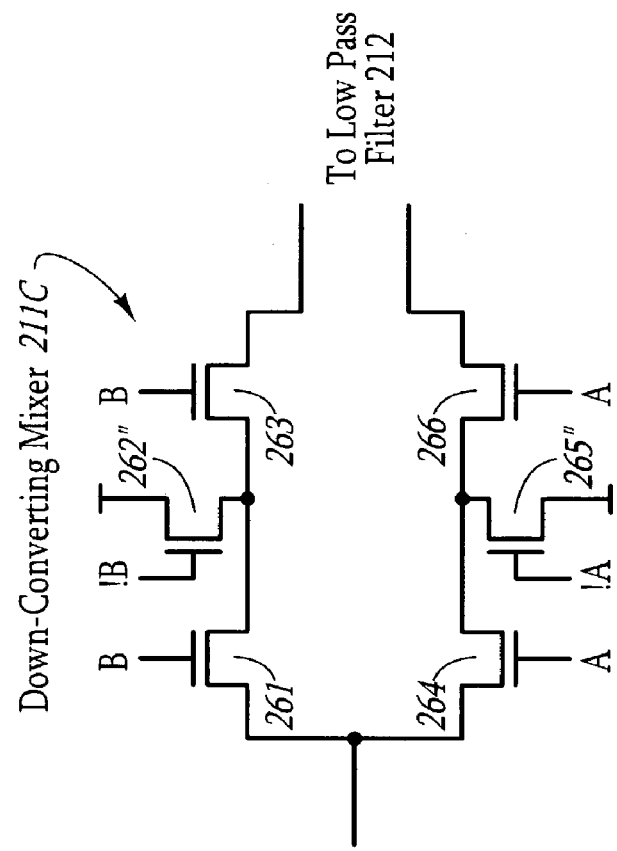
FIG. 2C illustrates a component-level circuit diagram showing a second alternative structure for the down-converting mixer.
Figure 2B:
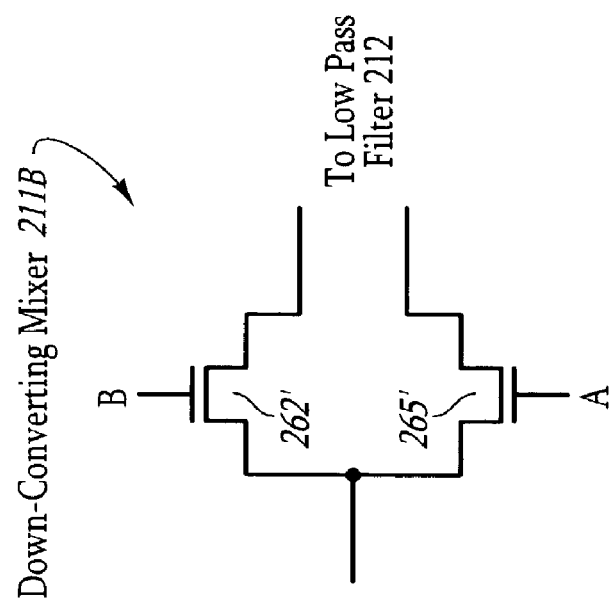
FIG. 2B illustrates a component-level circuit diagram showing an alternative structure for the down-converting mixer.

FIG. 2B illustrates an alternative embodiment of the down-converting mixer 211 in the form of down-converting mixer 211B. The down-converting mixer 211B is similar to the down-converting mixer 211, except that the field effect transistors 261, 263, 264 and 266 are not present, and field effect transistors 262' and 265' replace transistors 262 and 265.

FIG. 2C illustrates a second alternative embodiment of the down-converting mixer 211 in the form of down-converting mixer 211C. The down-converting mixer 211C is similar to the down-converting mixer 211, except that the field effect transistors 262" and 265" replace transistors 262 and 265.

Figure 3:
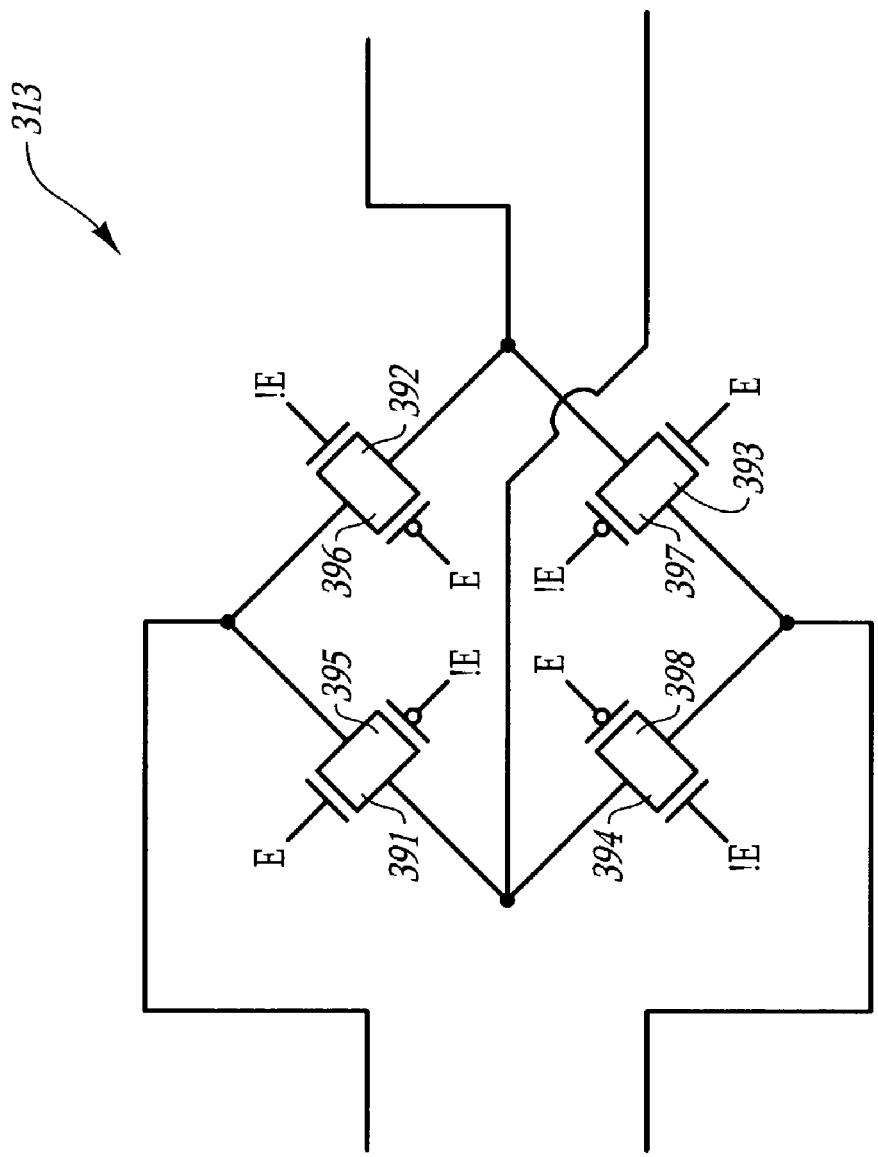
FIG. 3 illustrates a component-level circuit diagram showing further details of another embodiment of an up-converting mixer that may be used in the circuit of FIG. 1 as a passive element.

FIG. 3 illustrates an alternative structure 313 for the up-converting mixer 113. The up-converting mixer 313 includes field-effect transistors 391 through 394 which are configured the same as described above for respective transistors 291 through 294 in up-converting mixer 213. Additionally, the up-converting mixer 313 includes field-effect transistors 395 through 398 that have an opposite polarity as compared to respective field-effect transistors 391 through 394. For example, if field-effect transistors 391 through 394 are n-type field effect transistors as in the illustrated example, the field-effect transistors 395 through 398 would be p-type field effect transistors, and vice versa. Each of the field-effect transistors 395 through 398 are coupled between respective input terminal and respective output terminals as described above for corresponding field-effect transistors 291 through 294. In order to maximize dynamic range, the dc offsets at the input and output terminals of the up-converting mixer 313 should all be midway between the supply voltages Vdd and Vss.

Accordingly, a direct conversion receiver circuit has been described in which the characteristic problems associated with direct conversion receiver circuits are reduced by using passive elements and up-conversion subsequent to down-conversion, and by using compensating feedback paths. Specifically, dynamic range is preserved by reducing DC offset. Additionally, 1/f noise, and second-order intermodulation product may be reduced.

Having described an embodiment of the present invention, various modifications, additions, and deletions to this embodiment will be apparent to those of ordinary skill in the art after having reviewed this description, while still remaining and being recognized as being within the scope of the present invention.

Figure 4:
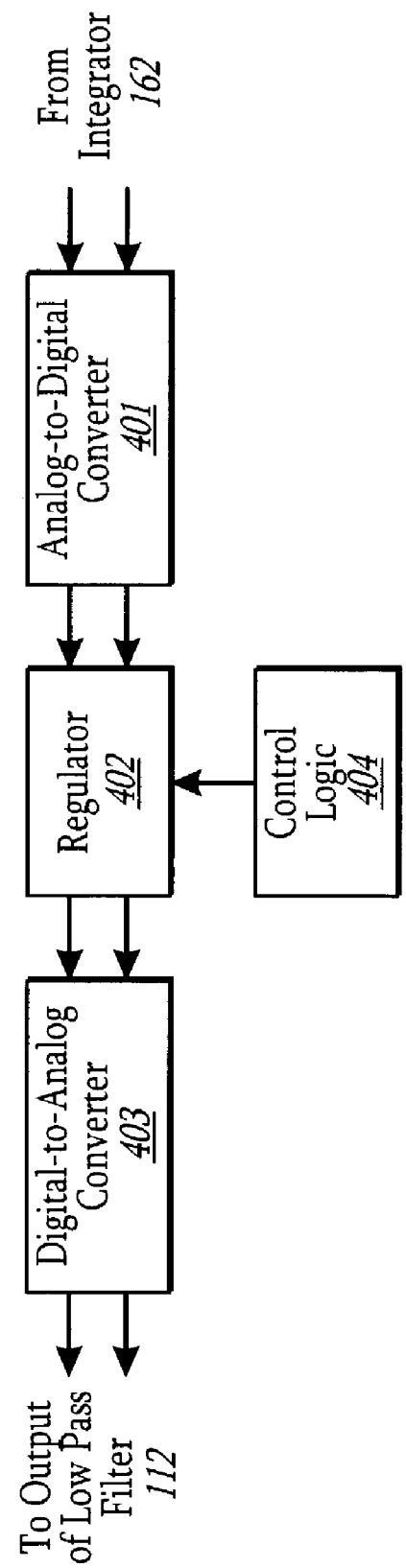
FIG. 4 illustrates a component-level circuit diagram in which DC offset is controlled digitally.
Figure 5:
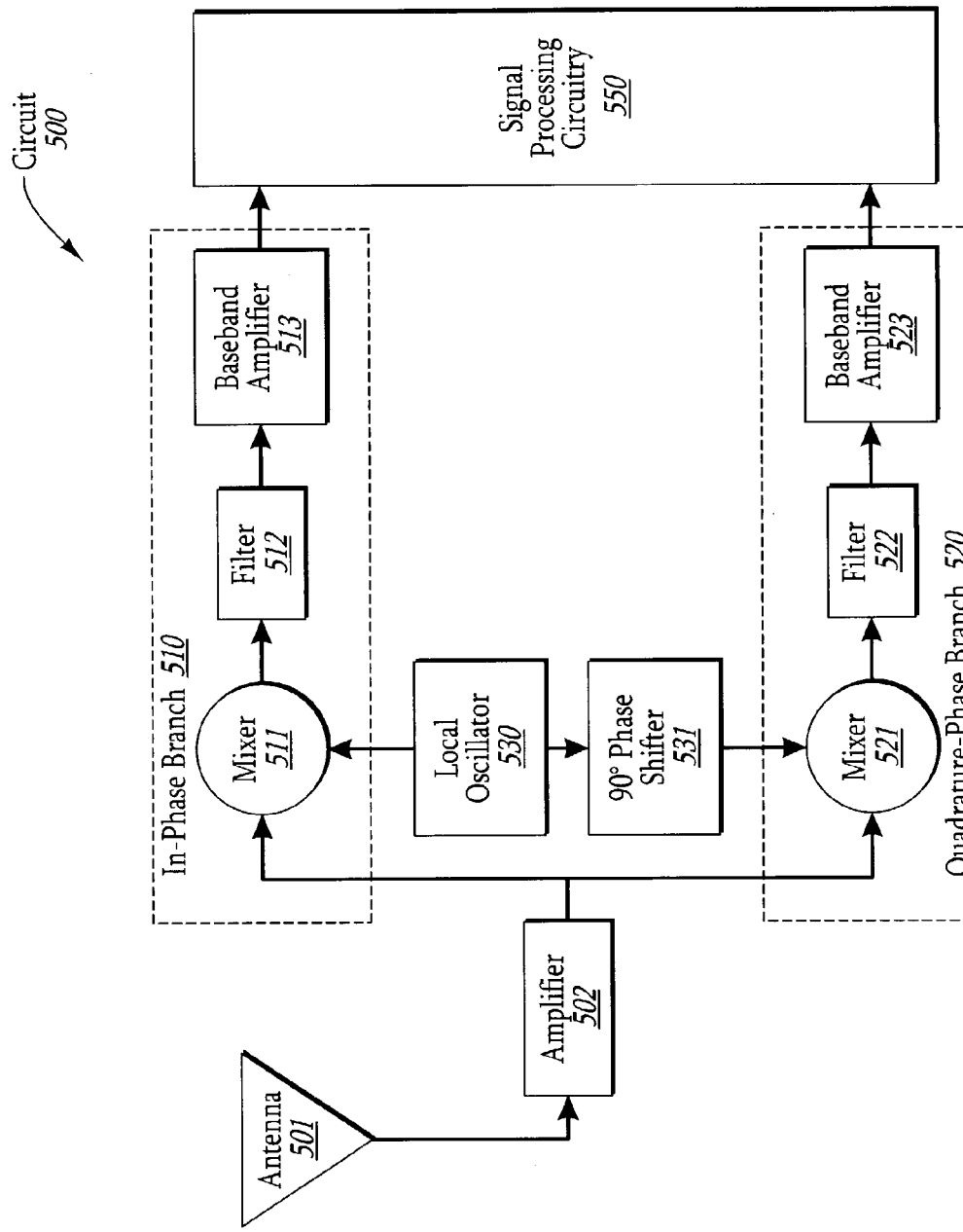
FIG. 5 illustrates a high-level circuit schematic of a direct conversion circuit in accordance with the prior art.

For example, FIG. 4 illustrates additional components that may be inserted in the in-phase feedback path between the integrator 162 and the output of the low pass filter. Specifically, an analog-to-digital converter 401 receives and digitizes the in-phase compensating signal received from the integrator. A regulator 402 receives and adjusts the digital value as directed by control logic 404. The digital output from the regulator 402 is then provided in digital form to the digital-to-analog converter 403 which generates a corresponding analog signal that may then be applied to the output of the low pass filter. The control logic 404 may use a sample of the DC offset to appropriately control the regulator 402 so as to reduce DC offset to below some minimal value.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A direct conversion receiver circuit comprising the following:
    a down-converting mixer that is configured to down-convert a received modulated signal to thereby generate a differential baseband signal;
    a low pass filter that is coupled to the down-converting mixer so as to filter high frequency components of the down-converted differential baseband signal to thereby generate a filtered differential down-converted signal;
    an up-converting mixer that is coupled to the low pass filter so as to receive and up-convert the filtered down-converted signal to generate a differential up-converted signal;
    a summer configured to receive and sum a signal that is at least derived from at least the filtered differential up-converted signal to thereby generate a summed signal;
    a compensating mixer configured to receive a signal that is at least derived from at least the summed signal, and configured to mix and down-convert the received signal to form a mixed differential signal; and
    an integrator configured to receive and integrate a differential signal that is at least derived from at least the mixed differential signal to generate an integrated differential signal that is at least indirectly applied back onto the differential output of the low pass filter.

2. A direct conversion receiver circuit in accordance with claim 1, further comprising the following:
    a down-converting oscillator that is coupled to the down-converting mixer so that a mixing frequency of the down-converting mixer is an approximate integer multiple of the modulation frequency of a received signal provided to the down-converting mixer.

3. A direct conversion receiver circuit in accordance with claim 1, further comprising the following:
    a first amplifier that is coupled to the up-converting mixer so as to receive and amplify the differential up-converted signal to generate a differential amplified signal, wherein the signal received by the summer is at least derived from at least the differential amplified signal.

4. The direct conversion receiver circuit in accordance with claim 1, wherein the integrator is configured such that the integrated differential signal is at least indirectly applied back onto the differential output of the low pass filter without using the summer.

5. The direct conversion receiver circuit in accordance with claim 1,
    wherein the compensating mixer and the integrator are included in a feedback path between the output of the summer and the input of the up-converting mixer.

6. A direct conversion receiver circuit comprising the following:
    a down-converting mixer that is configured to down-convert a received modulated signal to thereby generate a differential baseband signal;
    a low pass filter that is coupled to the down-converting mixer so as to filter high frequency components of the down-converted differential baseband signal to thereby generate a filtered differential down-converted signal;
    a summer configured to receive and sum a signal that is at least derived from at least the filtered differential down-converted signal to thereby generate a summed signal;
    a compensating mixer configured to receive a signal that is at least derived from at least the summed signal, and configured to mix the received signal to form a mixed differential signal;
    an integrator configured to receive and integrate a differential signal that is at least derived from at least the mixed differential signal to generate an integrated differential signal that is at least indirectly applied back onto the differential output of the low pass filter; and
    an up-converting mixer that is coupled to the low pass filter so as to receive and up-convert the filtered down-converted signal to generate a differential up-converted signal, wherein the signal received by the summer is at least derived from at least the differential up-converted signal, wherein control signals used by the up-converting mixer are also used by the compensating mixer.

7. A direct conversion receiver circuit comprising the following:
    an in-phase down-converting mixer that is configured to down-convert a received modulated signal to thereby generate an in-phase differential baseband signal;
    an in-phase low pass filter that is coupled to the in-phase down-converting mixer so as to filter high frequency components of the in-phase down-converted differential baseband signal to thereby generate an in-phase filtered differential down-converted signal;

an in-phase summer configured to receive and sum a signal that is at least derived from at least the in-phase filtered differential down-converted signal to thereby generate an in-phase summed signal;

an in-phase compensating mixer configured to receive a signal that is at least derived from at least the in-phase summed signal, and configured to mix the signal received at the in-phase compensating mixer to form an in-phase mixed differential signal;

an in-phase integrator configured to receive and integrate an in-phase differential signal that is at least derived from at least the in-phase mixed differential signal to generate an in-phase integrated differential signal that is at least indirectly applied back onto the differential output of the in-phase low pass filter;

an up-converting mixer that is coupled to the in-phase low pass filter so as to receive and up-convert the in-phase filtered down-converted signal to generate an in-phase differential up-converted signal, wherein the signal received by the in-phase summer is at least derived from at least the in-phase differential up-converted signal;

a first amplifier that is coupled to the in-phase up-converting mixer so as to receive and amplify the in-phase differential up-converted signal to generate an in-phase differential amplified signal, wherein the signal received by the in-phase summer is at least derived from at least the in-phase differential amplified signal;

a quadrature-phase down-converting mixer that is configured to down-convert a received modulated signal to thereby generate a quadrature-phase differential baseband signal;

a quadrature-phase low pass filter that is coupled to the quadrature-phase down-converting mixer so as to filter high frequency components of the quadrature-phase down-converted differential baseband signal to thereby generate a quadrature-phase filtered differential down-converted signal;

a quadrature-phase summer configured to receive and sum a signal that is at least derived from at least the quadrature-phase filtered differential down-converted signal to thereby generate a quadrature-phase summed signal;

a quadrature-phase compensating mixer configured to receive a signal that is at least derived from the in-phase summed signal and the quadrature-phase summed signal, and configured to mix the signal received at the quadrature-phase compensating mixer to form a quadrature-phase mixed differential signal, wherein the in-phase compensating mixer is also configured to receive the signal that is at least derived from the in-phase summed signal and the quadrature-phase summed signal; and a quadrature-phase integrator configured to receive and integrate a quadrature-phase differential signal that is at least derived from at least the quadrature-phase mixed differential signal to generate a quadrature-phase integrated differential signal that is at least indirectly applied back onto the differential output of the quadrature-phase low pass filter.

8. A direct conversion receiver circuit in accordance with claim 7, further comprising the following:

a second amplifier configured to receive the in-phase summed signal and the quadrature-phase summed signal and amplify the difference between the in-phase summed signal and the quadrature-phase summed signal to generate an amplified signal, wherein the signal received by the in-phase and quadrature-phase compensating mixers is at least derived from the amplified signal from the second amplifier.

9. A direct conversion receiver circuit in accordance with claim 8, further comprising the following:

a band pass filter configured to receive and filter the amplified signal from the second amplifier to generate a filtered amplified signal that is the signal received by the quadrature-phase and in-phase mixer.

10. A direct conversion receiver circuit in accordance with claim 6, wherein the down-converting mixer is an in-phase down-converting mixer, the differential baseband signal is an in-phase differential baseband signal, the low pass filter is an in-phase low pass filter, the filtered differential down-converted signal is an in-phase filtered differential down-converted signal, the summer is an in-phase summer, the summed signal is an in-phase summed signal, the compensating mixer is an in-phase compensating mixer, the mixed differential signal is an in-phase mixed differential signal, the integrator is an in-phase integrator, the integrated differential signal is an in-phase integrated differential signal, the direct conversion receiver circuit further comprising the following:

a quadrature-phase down-converting mixer that is configured to down-convert a received modulated signal to thereby generate a quadrature-phase differential baseband signal;

a quadrature-phase low pass filter that is coupled to the quadrature-phase down-converting mixer so as to filter high frequency components of the quadrature-phase down-converted differential baseband signal to thereby generate a quadrature-phase filtered differential down-converted signal;

a quadrature-phase summer configured to receive and sum a signal that is at least derived from at least the quadrature-phase filtered differential down-converted signal to thereby generate a quadrature-phase summed signal;

a quadrature-phase compensating mixer configured to receive a signal that is at least derived from the in-phase summed signal and the quadrature-phase summed signal, and configured to mix the signal received at the quadrature-phase compensating mixer to form a quadrature-phase mixed differential signal, wherein the in-phase compensating mixer is also configured to receive the signal that is at least derived from the in-phase summed signal and the quadrature-phase summed signal; and a quadrature-phase integrator configured to receive and integrate a quadrature-phase differential signal that is at least derived from at least the quadrature-phase mixed differential signal to generate a quadrature-phase integrated differential signal that is at least indirectly applied back onto the differential output of the quadrature-phase low pass filter.

11. A direct conversion receiver circuit in accordance with claim 10, further comprising the following:

an amplifier configured to receive the in-phase summed signal and the quadrature-phase summed signal and amplify the difference between the in-phase summed signal and the quadrature-phase summed signal to generate an amplified signal, wherein the signal received by the in-phase and quadrature-phase compensating mixers is at least derived from the amplified signal from the amplifier.

12. A direct conversion receiver circuit in accordance with claim 11, further comprising the following:

a band pass filter configured to receive and filter the amplified signal from the amplifier to generate a filtered amplified signal that is the signal received by the quadrature-phase and in-phase mixer.

13. A direct conversion receiver circuit comprising the following:

an in-phase down-converting mixer that is configured to down-convert a received modulated signal to thereby generate an in-phase differential baseband signal;

an in-phase low pass filter that is coupled to the in-phase down-converting mixer so as to filter high frequency components of the in-phase down-converted differential baseband signal to thereby generate an in-phase filtered differential down-converted signal;

an in-phase summer configured to receive and sum a signal that is at least derived from at least the in-phase filtered differential down-converted signal to thereby generate an in-phase summed signal;

an in-phase compensating mixer configured to receive a signal that is at least derived from at least the in-phase summed signal, and configured to mix the signal received at the in-phase compensating mixer to form an in-phase mixed differential signal;

an in-phase integrator configured to receive and integrate an in-phase differential signal that is at least derived from at least the in-phase mixed differential signal to generate an in-phase integrated differential signal that is at least indirectly applied back onto the differential output of the in-phase low pass filter;

an up-converting mixer that is coupled to the in-phase low pass filter so as to receive and up-convert the in-phase filtered down-converted signal to generate an in-phase differential up-converted signal, wherein the signal received by the in-phase summer is at least derived from at least the in-phase differential up-converted signal;

a quadrature-phase down-converting mixer that is configured to down-convert a received modulated signal to thereby generate a quadrature-phase differential baseband signal;

a quadrature-phase low pass filter that is coupled to the quadrature-phase down-converting mixer so as to filter high frequency components of the quadrature-phase down-converted differential baseband signal to thereby generate a quadrature-phase filtered differential down-converted signal;

a quadrature-phase summer configured to receive and sum a signal that is at least derived from at least the quadrature-phase filtered differential down-converted signal to thereby generate a quadrature-phase summed signal;

a quadrature-phase compensating mixer configured to receive a signal that is at least derived from the in-phase summed signal and the quadrature-phase summed signal, and configured to mix the signal received at the quadrature-phase compensating mixer to form a quadrature-phase mixed differential signal, wherein the in-phase compensating mixer is also configured to receive the signal that is at least derived from the in-phase summed signal and the quadrature-phase summed signal; and a quadrature-phase integrator configured to receive and integrate a quadrature-phase differential signal that is at least derived from at least the quadrature-phase mixed differential signal to generate a quadrature-phase integrated differential signal that is at least indirectly applied back onto the differential output of the quadrature-phase low pass filter.

14. A direct conversion receiver circuit in accordance with claim 13, further comprising the following:

an amplifier configured to receive the in-phase summed signal and the quadrature-phase summed signal and amplify the difference between the in-phase summed signal and the quadrature-phase summed signal to generate an amplified signal, wherein the signal received by the in-phase and quadrature-phase compensating mixers is at least derived from the amplified signal from the amplifier.

15. A direct conversion receiver circuit in accordance with claim 14, further comprising the following:

a band pass filter configured to receive and filter the amplified signal from the amplifier to generate a filtered amplified signal that is the signal received by the quadrature-phase and in-phase mixer.

16. A direct conversion receiver circuit comprising the following:

an in-phase down-converting mixer that is configured to down-convert a received modulated signal to thereby generate an in-phase differential baseband signal;

an in-phase low pass filter that is coupled to the in-phase down-converting mixer so as to filter high frequency components of the in-phase down-converted differential baseband signal to thereby generate an in-phase filtered differential down-converted signal;

an in-phase summer configured to receive and sum a signal that is at least derived from at least the in-phase filtered differential down-converted signal to thereby generate an in-phase summed signal;

an in-phase compensating mixer configured to receive a signal that is at least derived from at least the in-phase summed signal, and configured to mix the signal received at the in-phase compensating mixer to form an in-phase mixed differential signal;

an in-phase integrator configured to receive and integrate an in-phase differential signal that is at least derived from at least the in-phase mixed differential signal to generate an in-phase integrated differential signal that is at least indirectly applied back onto the differential output of the in-phase low pass filter;

a down-converting oscillator that is coupled to the in-phase down-converting mixer so that a mixing frequency of the in-phase down-converting mixer is an approximate integer multiple of the modulation frequency of a received signal provided to the in-phase down-converting mixer;

a quadrature-phase down-converting mixer that is configured to down-convert a received modulated signal to thereby generate a quadrature-phase differential baseband signal;

a quadrature-phase low pass filter that is coupled to the quadrature-phase down-converting mixer so as to filter high frequency components of the quadrature-phase down-converted differential baseband signal to thereby generate a quadrature-phase filtered differential down-converted signal;

a quadrature-phase summer configured to receive and sum a signal that is at least derived from at least the quadrature-phase filtered differential down-converted signal to thereby generate a quadrature-phase summed signal;

a quadrature-phase compensating mixer configured to receive a signal that is at least derived from the in-phase summed signal and the quadrature-phase summed signal, and configured to mix the signal received at the quadrature-phase compensating mixer to form a quadrature-phase mixed differential signal, wherein the in-phase compensating mixer is also configured to receive the signal that is at least derived from the in-phase summed signal and the quadrature-phase summed signal; and a quadrature-phase integrator configured to receive and integrate a quadrature-phase differential signal that is at least derived from at least the quadrature-phase mixed differential signal to generate a quadrature-phase integrated differential signal that is at least indirectly applied back onto the differential output of the quadrature-phase low pass filter.

17. A direct conversion receiver circuit in accordance with claim 16, further comprising the following:

an amplifier configured to receive the in-phase summed signal and the quadrature-phase summed signal and amplify the difference between the in-phase summed signal and the quadrature-phase summed signal to generate an amplified signal, wherein the signal received by the in-phase and quadrature-phase compensating mixers is at least derived from the amplified signal from the amplifier.

18. A direct conversion receiver circuit in accordance with claim 17, further comprising the following:

a band pass filter configured to receive and filter the amplified signal from the amplifier to generate a filtered amplified signal that is the signal received by the quadrature-phase and in-phase mixer.

19. A direct conversion receiver circuit comprising the following:

an in-phase down-converting mixer that is configured to down-convert a received modulated signal to thereby generate an in-phase differential baseband signal;

an in-phase low pass filter that is coupled to the in-phase down-converting mixer so as to filter high frequency components of the in-phase down-converted differential baseband signal to thereby generate an in-phase filtered differential down-converted signal;

an in-phase summer configured to receive and sum a signal that is at least derived from at least the in-phase filtered differential down-converted signal to thereby generate an in-phase summed signal;

an in-phase compensating mixer configured to receive a signal that is at least derived from at least the in-phase summed signal, and configured to mix the signal received at the in-phase compensating mixer to form an in-phase mixed differential signal;

an in-phase integrator configured to receive and integrate an in-phase differential signal that is at least derived from at least the in-phase mixed differential signal to generate an in-phase integrated differential signal that is at least indirectly applied back onto the differential output of the in-phase low pass filter;

a quadrature-phase down-converting mixer that is configured to down-convert a received modulated signal to thereby generate a quadrature-phase differential baseband signal;

a quadrature-phase low pass filter that is coupled to the quadrature-phase down-converting mixer so as to filter high frequency components of the quadrature-phase down-converted differential baseband signal to thereby generate a quadrature-phase filtered differential down-converted signal;

a quadrature-phase summer configured to receive and sum a signal that is at least derived from at least the quadrature-phase filtered differential down-converted signal to thereby generate a quadrature-phase summed signal;

a quadrature-phase compensating mixer configured to receive a signal that is at least derived from the in-phase summed signal and the quadrature-phase summed signal, and configured to mix the signal received at the quadrature-phase compensating mixer to form a quadrature-phase mixed differential signal, wherein the in-phase compensating mixer is also configured to receive the signal that is at least derived from the in-phase summed signal and the quadrature-phase summed signal; and a quadrature-phase integrator configured to receive and integrate a quadrature-phase differential signal that is at least derived from at least the quadrature-phase mixed differential signal to generate a quadrature-phase integrated differential signal that is at least indirectly applied back onto the differential output of the quadrature-phase low pass filter.

20. A direct conversion receiver circuit in accordance with claim 19, further comprising the following:

an amplifier configured to receive the in-phase summed signal and the quadrature-phase summed signal and amplify the difference between the in-phase summed signal and the quadrature-phase summed signal to generate an amplified signal, wherein the signal received by the in-phase and quadrature-phase compensating mixers is at least derived from the amplified signal from the amplifier.

21. A direct conversion receiver circuit in accordance with claim 20, further comprising the following:

a band pass filter configured to receive and filter the amplified signal from the amplifier to generate a filtered amplified signal that is the signal received by the quadrature-phase and in-phase mixer.

22. A direct conversion receiver circuit comprising the following:

a down-converting mixer that is configured to down-convert a received modulated signal to thereby generate a differential baseband signal;

a low pass filter that is coupled to the down-converting mixer so as to filter high frequency components of the down-converted differential baseband signal to thereby generate a filtered differential down-converted signal;

a summer configured to receive and sum a signal that is at least derived from at least the filtered differential down-converted signal to thereby generate a summed signal;

a compensating mixer configured to receive a signal that is at least derived from at least the summed signal, and configured to mix the received signal to form a mixed differential signal;

an integrator configured to receive and integrate a differential signal that is at least derived from at least the mixed differential signal to generate an integrated differential signal that is at least indirectly applied back onto the differential output of the low pass filter;

an analog-to-digital conversion circuit that is coupled to receive the integrated differential signal to generate a digital representation of the integrated differential signal;

a regulator configured to change a digital value of the digital representation of the integrated differential signal to generate an altered digital signal; and a digital-to-analog conversion circuit that is configured to convert the altered digital signal to an altered analog signal and apply the altered analog signal to the differential output of the low pass filter.

23. A direct conversion receiver circuit comprising the following:
- an in-phase down-converting mixer that is configured to down-convert a received modulated signal to thereby generate an in-phase differential baseband signal;
- an in-phase low pass filter that is coupled to the in-phase down-converting mixer so as to filter high frequency components of the in-phase down-converted differential baseband signal to thereby generate an in-phase filtered differential down-converted signal;
- an in-phase up-converting mixer that is coupled to the in-phase low pass filter so as to receive and up-convert the in-phase filtered down-converted signal to generate an in-phase differential up-converted signal;
- an in-phase amplifier that is coupled to the in-phase up-converting mixer so as to receive and amplify the in-phase differential up-converted signal to generate an in-phase differential amplified signal;
- an in-phase summer that is coupled to the in-phase amplifier so as to receive and sum the in-phase amplified differential amplified signal to generate an in-phase summed signal;
- a quadrature-phase down-converting mixer that is configured to down-convert a received modulated signal to thereby generate a quadrature-phase differential baseband signal;
- a quadrature-phase low pass filter that is coupled to the quadrature-phase down-converting mixer so as to filter high frequency components of the quadrature-phase down-converted differential baseband signal to thereby generate a quadrature-phase filtered differential down-converted signal;
- a quadrature-phase up-converting mixer that is coupled to the quadrature-phase low pass filter so as to receive and up-convert the quadrature-phase filtered down-converted signal to generate a quadrature-phase differential up-converted signal;
- a quadrature-phase amplifier that is coupled to the quadrature-phase up-converting mixer so as to receive and amplify the quadrature-phase differential up-converted signal to generate a quadrature-phase differential amplified signal;
- a quadrature-phase summer that is coupled to the quadrature-phase amplifier so as to receive and sum the quadrature-phase amplified differential amplified signal to generate a quadrature-phase summed signal;
- a differential amplifier configured to receive the in-phase summed signal and the quadrature-phase summed signal and amplify the difference between the in-phase summed signal and the quadrature-phase summed signal to generate an amplified signal;
- a band pass filter configured to receive and filter the amplified signal to generate a filtered amplified signal from the differential amplifier;
- an in-phase compensating mixer configured to receive the filtered amplified signal to form an in-phase mixed differential signal;
- an in-phase integrator configured to receive and integrate the in-phase mixed differential signal to generate an in-phase integrated signal that is at least indirectly applied to the in-phase filtered differential down-converted signal;
- a quadrature-phase compensating mixer configured to receive the filtered amplified signal to form a quadrature-phase mixed differential signal; and
- a quadrature-phase integrator configured to receive and integrate the quadrature-phase mixed differential signal to generate a quadrature-phase integrated signal that is at least indirectly applied to the quadrature-phase filtered differential down-converted signal.

24. A direct conversion receiver circuit in accordance with claim 23, further comprising the following:
- an in-phase analog-to-digital conversion circuit that is coupled to receive the in-phase integrated signal to generate a digital representation of the in-phase integrated differential signal;
- an in-phase regulator configured to change a digital value of the in-phase digital representation of the integrated differential signal to generate an altered in-phase digital signal; and
- an in-phase digital-to-analog conversion circuit that is configured to convert the altered in-phase digital signal to an altered in-phase analog signal and apply the altered in-phase analog signal to the differential output of the in-phase low pass filter.

25. A direct conversion receiver circuit in accordance with claim 24, further comprising the following:
- a quadrature-phase analog-to-digital conversion circuit that is coupled to receive the quadrature-phase integrated signal to generate a digital representation of the quadrature-phase integrated differential signal;
- a quadrature-phase regulator configured to change a digital value of the quadrature-phase digital representation of the integrated differential signal to generate an altered quadrature-phase digital signal; and
- a quadrature-phase digital-to-analog conversion circuit that is configured to convert the altered quadrature-phase digital signal to an altered quadrature-phase analog signal and apply the altered quadrature-phase analog signal to the differential output of the quadrature-phase low pass filter.

26. A direct conversion receiver circuit in accordance with claim 23, further comprising the following:
- a quadrature-phase analog-to-digital conversion circuit that is coupled to receive the quadrature-phase integrated signal to generate a digital representation of the quadrature-phase integrated differential signal;
- a quadrature-phase regulator configured to change a digital value of the quadrature-phase digital representation of the integrated differential signal to generate an altered quadrature-phase digital signal; and
- a quadrature-phase digital-to-analog conversion circuit that is configured to convert the altered quadrature-phase digital signal to an altered quadrature-phase analog signal and apply the altered quadrature-phase analog signal to the differential output of the quadrature-phase low pass filter.

* * * * *